(12) United States Patent
Wakabayashi

(10) Patent No.: US 9,962,840 B2
(45) Date of Patent: May 8, 2018

(54) SUBSTRATE CONVEYANCE APPARATUS

(71) Applicant: Tokyo Electron Limited, Tokyo (JP)

(72) Inventor: Shinji Wakabayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 14/855,561

(22) Filed: Sep. 16, 2015

(65) Prior Publication Data

US 2016/0082599 A1 Mar. 24, 2016

(30) Foreign Application Priority Data

Sep. 19, 2014 (JP) .................................. 2014-191655

(51) Int. Cl.
*H01L 21/677* (2006.01)
*B25J 11/00* (2006.01)
(Continued)

(52) U.S. Cl.
CPC ........... *B25J 11/0095* (2013.01); *B25J 9/107* (2013.01); *B25J 15/0052* (2013.01); *H01L 21/67196* (2013.01); *H01L 21/67201* (2013.01); *H01L 21/67742* (2013.01); *H01L 21/67754* (2013.01); *H01L 21/67781* (2013.01)

(58) Field of Classification Search
CPC ......... H01L 21/67201; H01L 21/67754; H01L 21/67781; H01L 21/67742; H01L 21/67196
See application file for complete search history.

(56) References Cited

U.S. PATENT DOCUMENTS 6,158,941 A * 12/2000 Muka ....................... B25J 9/107
294/87.1
7,704,036 B2 * 4/2010 Sato ......................... B25J 9/107
414/744.5
(Continued)

FOREIGN PATENT DOCUMENTS

JP 10-340940 A 12/1998
JP 4999783 B 8/2012
(Continued)

*Primary Examiner* — Anna M Momper
*Assistant Examiner* — Ronald P Jarrett
(74) *Attorney, Agent, or Firm* — Abelman, Frayne & Schwab

(57) ABSTRACT

Disclosed is a substrate conveyance apparatus that collectively conveys a plurality of substrates. The apparatus includes: a plurality of substrate placement racks disposed at intervals in a height direction and configured to simultaneously place the substrates thereon; a substrate placement rack holder configured to integrally hold the plurality of substrate placement racks; and a moving mechanism connected to the substrate placement rack holder and configured to integrally move the plurality of substrate placement racks. The moving mechanism includes: a first arm unit having a first support supported from an outside, and connected to one end of the substrate placement rack holder in a longitudinal direction; a second arm unit having a second support supported from the outside, and connected to another end of the substrate placement rack holder in the longitudinal direction; and a connecting portion which connects the first arm unit to the second arm unit.

13 Claims, 4 Drawing Sheets

(51) Int. Cl.
 *B25J 15/00* (2006.01)
 *B25J 9/10* (2006.01)
 *H01L 21/67* (2006.01)

(56) References Cited

U.S. PATENT DOCUMENTS

| | | | | |
|---|---|---|---|---|
| 7,871,233 B2 * | 1/2011 | Arrez | ................. | B65F 3/041 |
| | | | | 187/269 |
| 2002/0098072 A1 * | 7/2002 | Sundar | ................. | B25J 9/042 |
| | | | | 414/744.5 |
| 2009/0162179 A1 * | 6/2009 | Hosek | ............... | H01L 21/67161 |
| | | | | 414/749.2 |

FOREIGN PATENT DOCUMENTS

| JP | 2013-093615 A | 5/2013 |
|---|---|---|
| JP | 2013-149906 A | 8/2013 |
| JP | 2013-219397 A | 10/2013 |

* cited by examiner

SUBSTRATE CONVEYANCE APPARATUS

CROSS-REFERENCE TO RELATED APPLICATIONS

This application is based on and claims priority from Japanese Patent Application No. 2014-191655, filed on Sep. 19, 2014, with the Japan Patent Office, the disclosure of which is incorporated herein in its entirety by reference.

TECHNICAL FIELD

The present disclosure relates to a substrate conveyance apparatus.

BACKGROUND

In order to achieve a high productivity, a multi-stage film-forming device configured to collectively process a plurality of wafers which are stacked in multiple stages has recently been developed. As for a method of conveying wafers to the multi-stage film-forming device, a method of sequentially conveying the wafers, one by one, to respective stages by a scara-type robot is used. In this method, when the wafers are conveyed to all the stages of the multi-stage film-forming device, the wafers are conveyed by the scara-type robot by the number of times corresponding to the number of the stages of the film-forming device, resulting in an increase of a time required for conveyance of the wafers.

Accordingly, a method of simultaneously holding a plurality of wafers by a plurality of substrate placement racks, and collectively conveying the wafers so as to shorten a time required for conveyance of the wafers has been disclosed (see, e.g., Japanese Patent Laid-Open Publication No. H10-340940).

SUMMARY

The present disclosure provides a substrate conveyance apparatus that collectively conveys a plurality of substrates. The substrate conveyance apparatus includes: a plurality of substrate placement racks disposed at intervals in a height direction, and configured to simultaneously place the plurality of substrates thereon; a substrate placement rack holder configured to integrally hold the plurality of substrate placement racks; and a moving mechanism connected to the substrate placement rack holder and configured to integrally move the plurality of substrate placement racks. The moving mechanism includes: a first arm unit having a first support supported from an outside, and connected to one end of the substrate placement rack holder in a longitudinal direction; a second arm unit having a second support supported from the outside, and connected to another end of the substrate placement rack holder in the longitudinal direction; and a connecting portion which connects the first arm unit to the second arm unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
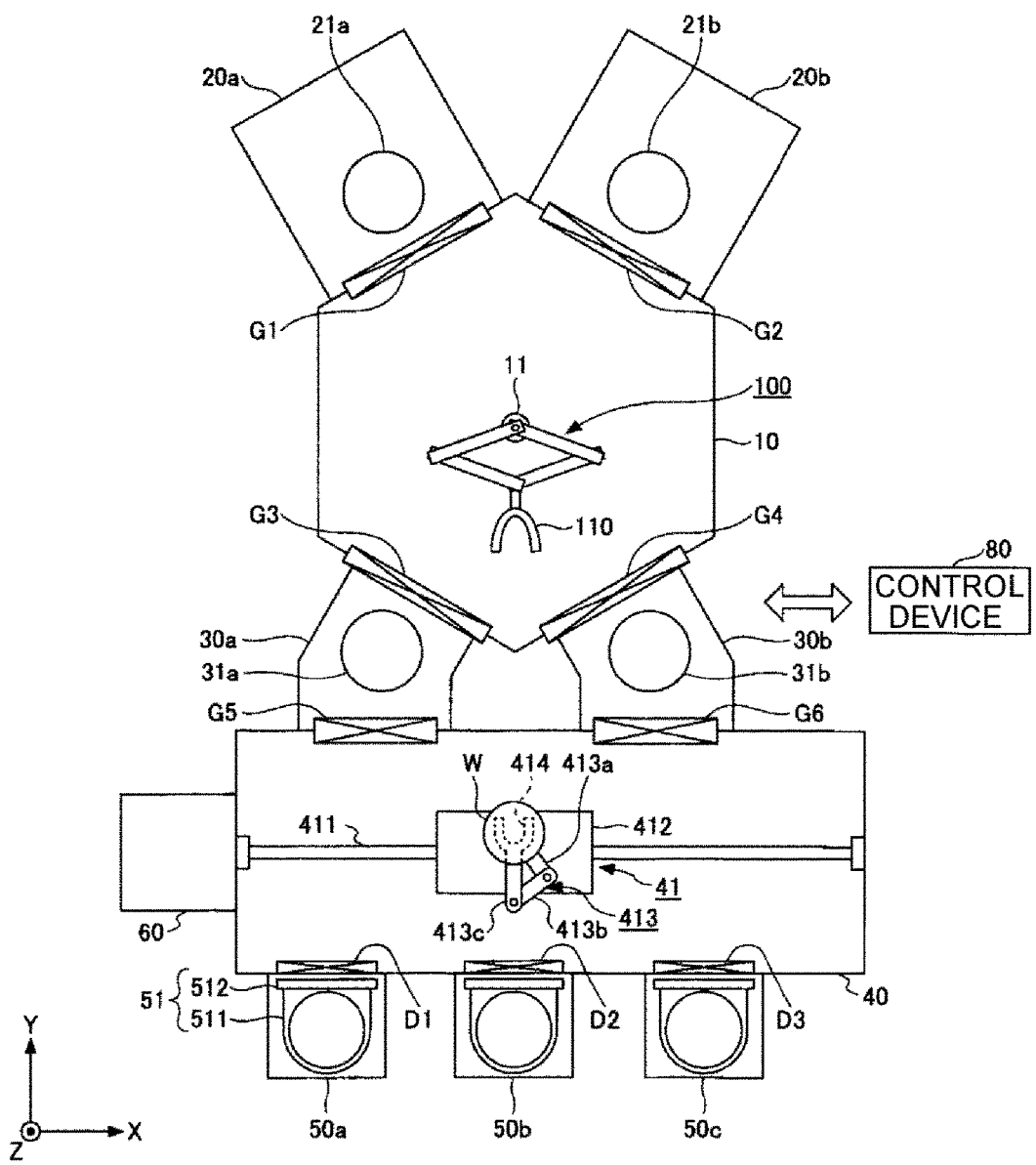
FIG. 1 is a plan view illustrating a schematic configuration of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the configuration as described above, since the loads of the front end portions of the substrate placement racks are increased, the substrate placement racks may be deflected.

Accordingly, an object according to an aspect of the present disclosure is to suppress deflection of a substrate placement rack in the substrate conveyance apparatus configured to perform a multi-stage collective conveyance.

In an aspect, there is provided a substrate conveyance apparatus that collectively conveys a plurality of substrates. The substrate conveyance apparatus includes: a plurality of substrate placement racks disposed at intervals in a height direction, and configured to simultaneously place the plurality of substrates thereon; a substrate placement rack holder configured to integrally hold the plurality of substrate placement racks; and a moving mechanism connected to the substrate placement rack holder and configured to integrally move the plurality of substrate placement racks. The moving mechanism includes: a first arm unit having a first support supported from an outside, and connected to one end of the substrate placement rack holder in a longitudinal direction; a second arm unit having a second support supported from the outside, and connected to another end of the substrate placement rack holder in the longitudinal direction; and a connecting portion which connects the first arm unit to the second arm unit.

In the substrate conveyance apparatus, the moving mechanism is configured to be rotatable around a rotational axis that passes through the first support and the second support.

In the substrate conveyance apparatus, one of the first arm unit and the second arm unit operates in interlocking with another one.

The substrate conveyance apparatus further includes a frame configured to support the first support and the second support.

In the substrate conveyance apparatus, the frame includes: a lower frame configured to support the first support; an upper frame provided parallel to the lower frame and configured to support the second support; and a pair of vertical frames fixed to the lower frame and the upper frame. The moving mechanism moves the plurality of substrate placement racks to pass between the pair of vertical frames so that the plurality of substrates are conveyed.

The substrate conveyance apparatus is provided in a vacuum conveyance chamber.

In the substrate conveyance apparatus, the first support is directly or indirectly rotatably supported on a bottom surface of the vacuum conveyance chamber, and the second support is directly or indirectly rotatably supported on a top surface of the vacuum conveyance chamber.

In the substrate conveyance apparatus, the first arm unit and the second arm unit constitute a multi-joint arm.

According to an aspect, in the substrate conveyance apparatus configured to perform a multi-stage collective conveyance, the deflection of a substrate placement rack may be suppressed.

Hereinafter, exemplary embodiments of the present disclosure will be described with reference to accompanying drawings. Meanwhile, in the present specification and the drawings, elements having substantially the same function and structure are given the same reference numerals to omit duplicate explanation.

(Overall Configuration of Substrate Processing System)

Figure 2:
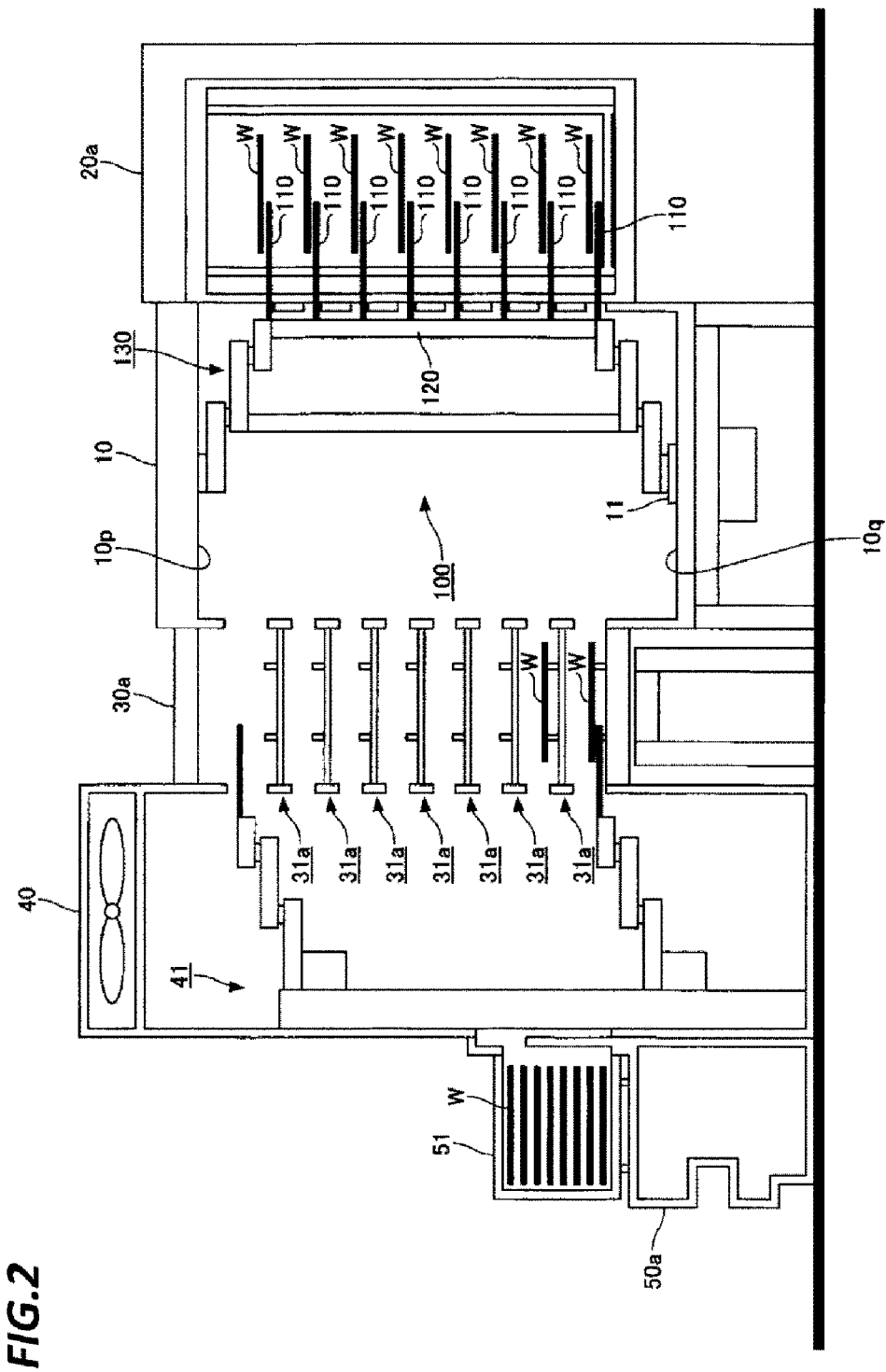
FIG. 2 is a sectional view illustrating a schematic configuration of the substrate processing system according to the exemplary embodiment of the present disclosure.

First, the overall configuration of a substrate processing system according to an exemplary embodiment of the present disclosure will be described with reference to FIGS. 1 and 2. FIG. 1 is a plan view illustrating a schematic configuration of a substrate processing system according to an exemplary embodiment of the present disclosure. FIG. 2 is a sectional view illustrating a schematic configuration of the substrate processing system according to the exemplary embodiment of the present disclosure.

As illustrated in FIG. 1, the substrate processing system includes a substantially hexagonal transfer module 10, two process modules 20a and 20b disposed at two sides of the transfer module 10, two load-lock modules 30a and 30b disposed at the other two sides of the transfer module 10, and an atmospheric conveyance module 40 connected to the load-lock modules 30a and 30b at the opposite side to a connection side of the transfer module 10.

The transfer module 10 is a module configured to convey wafers W between the process modules 20a and 20b and the load-lock modules 30a and 30b and between the process module 20a and the process module 20b. In the transfer module 10, a substrate conveyance apparatus 100 constituted by a scara arm-type conveyance arm is provided within a vacuum conveyance chamber.

As illustrated in FIG. 2, the substrate conveyance apparatus 100 includes a plurality of substrate placement racks 110 disposed at intervals in the height direction. The substrate conveyance apparatus 100 is rotatably supported on, for example, a top surface 10p of a housing of the transfer module 10, and is rotatably supported on a bottom surface 10q through a support 11. Then, the substrate conveyance apparatus 100 rotates and expands the plurality of substrate placement racks 110 so as to convey a plurality of wafers W collectively (at once) to the process modules 20a and 20b or the load-lock modules 30a and 30b through the transfer module 10. Meanwhile, details of the configuration of the substrate conveyance apparatus 100 will be described later.

Each of the process modules 20a and 20b is a module configured to perform a predetermined substrate processing such as, for example, an etching processing or a film-forming processing on wafers W. The process module 20a (20b) has a plurality of stages 21a (21b) (e.g., eight stages) configured to place the wafers W thereon, within a vacuum processing chamber. The stages 21a (21b) are provided at intervals in the height direction. Then, the spacing between adjacent stages is configured to be the same as that of the adjacent substrate placement racks 110 in the substrate conveyance apparatus 100 of the transfer module 10. Meanwhile, the process module 20a (20b) may be composed of independent processing chambers of which the number corresponds to the plurality of stages 21a (21b), or may be composed of one processing chamber having the plurality of stages 21a (21b).

Each of the load-lock modules 30a and 30b is a module configured to transfer wafers W between the transfer module 10 and the atmospheric conveyance module 40. The load-lock module 30a (30b) has a plurality of stages 31a (31b) (e.g., eight stages) configured to place the wafers W thereon. The stages 31a (31b) are provided at intervals in the height direction. Then, the spacing between adjacent stages is configured to be the same as that of the adjacent substrate placement racks 110 in the substrate conveyance apparatus 100 of the transfer module 10. The load-lock module 30a (30b) is configured to switch the internal pressure between a predetermined vacuum atmosphere and an air atmosphere formed by, for example, a nitrogen ($N_2$) gas.

The atmospheric conveyance module 40 is formed in a box shape of which the horizontal direction (the X direction in FIG. 1) is a longitudinal direction. The load-lock modules 30a and 30b are connected to one side surface of the atmospheric conveyance module 40 in the longitudinal direction. A plurality of load ports 50a, 50b, and 50c (e.g., three load ports) are connected to the other side surface of the atmospheric conveyance module 40 in the longitudinal direction. On each of the plurality of load ports 50a, 50b, and 50c, a front-opening unified pod (FOUP) 51 may be placed. The FOUP 51 is a transport container configured to accommodate, for example, 25 wafers W in a shelf form. The FOUP 51 has a main body 511 having an outlet through which the wafers W are taken out at the front side, and a lid 512 that covers the outlet. A conveyance mechanism 41 is disposed within the atmospheric conveyance module 40.

The conveyance mechanism 41 has a guide rail 411, a support 412, and a conveyance arm 413, and conveys wafers W within the atmospheric conveyance module 40. The guide rail 411 is disposed in the longitudinal direction within the atmospheric conveyance module 40. The support 412 supports the conveyance arm 413 and slides on the guide rail 411 in the longitudinal direction.

The conveyance arm 413 has a joint portion and is rotatable around the joint portion as an axis. In the conveyance arm 413 illustrated in FIG. 1, three arm portions 413a, 413b, and 413c are connected to each other through two joint portions, and are rotatable around the respective joint portions as axes. A pick 414 configured to place a wafer W thereon is attached to the front end portion of the conveyance arm 413. Meanwhile, the number of joint portions of the conveyance arm 413 is not particularly limited as long as it is one or more. Also, in the configuration of FIG. 1, the arm portions 413a, 413b, and 413c are rotated around the joint portions as axes to move the pick 414 at the front end portion, but the present disclosure is not limited thereto. For example, a configuration in which an arm portion is extended and retracted through a joint portion as a start point to move the pick 414 at the front end portion may be employed.

An orientor 60 is disposed in the atmospheric conveyance module 40 to align the position of the wafer W carried from the FOUP 51 into the atmospheric conveyance module 40.

Gate valves G1 and G2 are provided between the transfer module 10 and the process modules 20a and 20b, respectively. When the gate valves G1 and G2 are opened, the transfer module 10 and the process modules 20a and 20b are communicated with each other.

Gate valves G3 and G4 are provided between the transfer module 10 and the load-lock modules 30a and 30b, respectively. When the gate valves G3 and G4 are opened, the transfer module 10 and the load-lock modules 30*a* and 30*b* are communicated with each other.

Gate valves G5 and G6 are provided between the load-lock modules 30*a* and 30*b* and the atmospheric conveyance module 40, respectively. When the gate valves G5 and G6 are opened, the load-lock modules 30*a* and 30*b* and the atmospheric conveyance module 40 are communicated with each other.

Opening/closing doors D1, D2, and D3 are provided between the atmospheric conveyance module 40 and the load ports 50*a*, 50*b*, and 50*c*, respectively. When the opening/closing doors D1, D2 and D3 and the lids 512 of the FOUPs 51 are opened, the inside of the atmospheric conveyance module 40 is communicated with the inside of each of the FOUPs 51 placed on the load ports 50*a*, 50*b*, and 50*c*.

The substrate processing system has a control device 80 configured to control operations of, for example, the transfer module 10, the process modules 20*a* and 20*b*, the load-lock modules 30*a* and 30*b*, the atmospheric conveyance module 40, the load ports 50*a*, 50*b*, and 50*c*, the orientor 60, the gate valves G1 to G6, and the opening/closing doors D1 to D3.

The control device 80 is also connected to, for example, a host computer so as to transmit and receive desired data from/to the host computer. The control device 80 has a central processing unit (CPU), a read only memory (ROM), and a random access memory (RAM). The CPU performs a substrate processing according to various recipes stored in a storage area of the ROM and the RAM.

(Operation of Substrate Processing System)

Hereinafter, an exemplary operation of the substrate processing system described above will be described. Meanwhile, the operation of the substrate processing system is implemented by the control device 80 as described above.

First, the control device 80 removes the lid 512 of the FOUP 51 placed on the load port 50*a* by the load port (e.g., the load port 50*a*). Subsequently, the control device 80 takes out a non-processed wafer W from the FOUP 51 by the conveyance mechanism 41 through a wafer conveyance port, and caries the wafer W into the atmospheric conveyance module 40.

Subsequently, the control device 80 conveys the non-processed wafer W to the orientor 60 through the inside of the atmospheric conveyance module 40 by the conveyance arm 413. Subsequently, the control device 80 performs alignment of the position of the wafer W by the orientor 60. Subsequently, the control device 80 takes out the positioned wafer W from the orientor 60 by the conveyance arm 413, and slides the support 412 to convey the wafer W from the orientor 60 to the front side of the load-lock module (e.g., the load-lock module 30*a*). Here, when the gate valve G5 is closed, the control device 80 opens the gate valve G5.

After the gate valve G5 is opened, the control device 80 puts the non-processed wafer W in the load-lock module 30*a* by the conveyance arm 413, and places the wafer W on the stage 31*a*. This operation, that is, an operation of placing the non-processed wafer W on the stage 31*a* provided within the load-lock module 30*a* from the FOUP 51, is repeated by the same number of times as the number of the stages 31*a* (e.g., 8 times) so that the non-processed wafers W are placed on all the stages 31*a*.

After the non-processed wafers W are placed on the stages 31*a* provided within the load-lock module 30*a*, the control device 80 closes the gate valve G5 and evacuates the inside of the load-lock module 30*a* to a pressure corresponding to that of the transfer module 10. Then, the control device 80 opens the gate valve G3, takes out the non-processed wafers W placed on the stages 31*a* by the substrate conveyance apparatus 100, and carries the wafers W into the transfer module 10. Meanwhile, the substrate conveyance apparatus 100 according to the present exemplary embodiment includes the plurality of substrate placement racks 110 at positions corresponding to the plurality of stages 31*a* provided within the load-lock module 30*a*. Accordingly, the non-processed wafers W placed within the load-lock module 30*a* may be collectively carried into the transfer module 10.

After the non-processed wafers W are carried into the transfer module 10, the control device 80 closes the gate valve G3, and opens the gate valve G1 between the transfer module 10 and the process module (e.g., the process module 20*a*). Subsequently, the control device 80 conveys the non-processed wafers W to the process module 20*a* by the substrate conveyance apparatus 100 through the inside of the transfer module 10, and places the non-processed wafers W on the stages 21*a*. Meanwhile, the substrate conveyance apparatus 100 according to the present exemplary embodiment includes the plurality of substrate placement racks 110 at positions corresponding to the plurality of stages 21*a* provided within the process module 20*a*. Therefore, the non-processed wafers W held by the substrate conveyance apparatus 100 may be collectively placed on the plurality of stages 21*a* within the process module 20*a*.

After the non-processed wafers W are placed on the stages 21*a* provided within the process module 20*a*, the control device 80 closes the gate valve G1. Subsequently, the control device 80 performs a predetermined substrate processing such as, for example, an etching processing or a film-forming processing, on the non-processed wafers W by the process module 20*a*.

After the predetermined substrate processing is performed on the non-processed wafers W, the control device 80 opens the gate valve G1. Subsequently, the control device 80 takes out the processed wafers W from the stages 21*a* provided within the process module 20*a* by the substrate conveyance apparatus 100.

After the processed wafers W are taken out, the control device 80 closes the gate valve G1, and opens the gate valve G4 between the transfer module 10 and the load-lock module (e.g., the load-lock module 30*b*). Subsequently, the control device 80 conveys the processed wafers W to the load-lock module 30*b* by the substrate conveyance apparatus 100, and places the wafers W on the stages 31*b* provided within the load-lock module 30*b*. Meanwhile, the substrate conveyance apparatus 100 according to the present exemplary embodiment includes the plurality of substrate placement racks 110 at positions corresponding to the plurality of stages 31*b* provided within the load-lock module 30*b*. Accordingly, the processed wafers W held by the substrate conveyance apparatus 100 may be collectively placed on the plurality of stages 31*b* within the load-lock module 30*b*.

After the processed wafers W are placed on the stages 31*b*, the control device 80 closes the gate valve G4. Subsequently, the control device 80 introduces an inert gas such as, for example, a nitrogen ($N_2$) gas, into the load-lock module 30*b* by a gas supply source so as to switch the inside of the load-lock module 30*b* from a vacuum atmosphere to an air atmosphere.

Then, the control device 80 opens the gate valve G6, sequentially takes out the processed wafers W from the load-lock module 30*b* by the conveyance arm 413, and conveys the wafers W to the FOUP 51. After taking out all the processed wafers W placed on the plurality of stages 31*b* provided within the load-lock module 30*b*, the control device 80 closes the gate valve G6.

As described above, the overall configuration and the operation of the substrate processing system according to the exemplary embodiment of the present disclosure have been described.

Meanwhile, in the present exemplary embodiment, descriptions have been made on a configuration where non-processed wafers W are processed by the process module 20a, but the present disclosure is not limited thereto. A configuration where non-processed wafers W are processed by the process module 20b may be employed. Also, a configuration where non-processed wafers W are processed by the process module 20a and the process module 20b may be employed.

In the present exemplary embodiment, a configuration where two process modules 20a and 20b are included has been described, but the present disclosure is not limited thereto. For example, the number of process modules may be one or three or more. As the number of the process modules increases, the number of times of conveyance of the wafers W by the substrate conveyance apparatus 100 provided in the transfer module 10 increases. Thus, the substrate conveyance apparatus 100 according to the present exemplary embodiment, that may perform a multi-stage collective conveyance, is especially effective.

(Configuration of Substrate Conveyance Apparatus)

Hereinafter, details of the configuration and operation of the substrate conveyance apparatus will be described.

[First Exemplary Embodiment]

Figure 3:
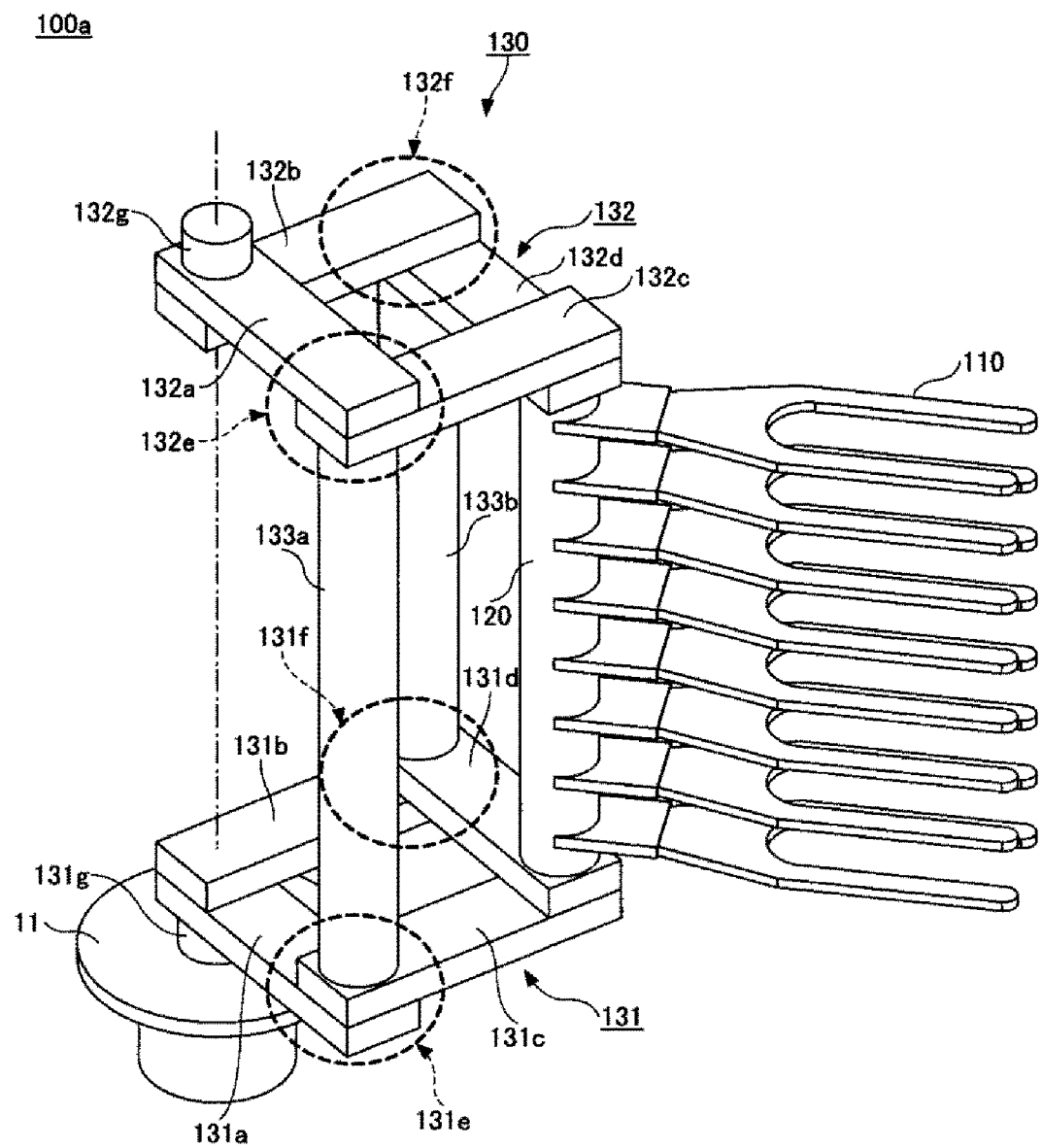
FIG. 3 is a perspective view illustrating a schematic configuration of a substrate conveyance apparatus according to a first exemplary embodiment of the present disclosure.

FIG. 3 is a perspective view illustrating a schematic configuration of a substrate conveyance apparatus according to a first exemplary embodiment of the present disclosure.

As illustrated in FIG. 3, a substrate conveyance apparatus 100a includes a plurality of substrate placement racks 110, a substrate placement rack holder 120 configured to integrally hold the plurality of substrate placement racks 110, and a moving mechanism 130 configured to integrally move the plurality of substrate placement racks 110.

The plurality of substrate placement racks 110 are integrally held by the substrate placement rack holder 120 at intervals in the height direction. The spacing between the adjacent substrate placement racks 110 in the plurality of substrate placement racks 110 is configured to be the same as that of the adjacent stages 21a, 21b, 31a and 31b in the process modules 20a and 20b and the load-lock modules 30a and 30b. Accordingly, a plurality of wafers W held by the plurality of substrate placement racks 110 may be collectively placed on the stages 21a, 21b, 31a and 31b provided within the process modules 20a and 20b and the load-lock modules 30a and 30b. The plurality of substrate placement racks 110 are held by the substrate placement rack holder 120 such that their arrangement positions in the horizontal direction are the same. That is, as illustrated in FIG. 1, the plurality of substrate placement racks 110 are placed in a completely overlapping state in a plan view. The shape of each of the plurality of substrate placement racks 110 is not particularly limited as long as wafers W may be placed on the substrate placement racks 110. For example, as illustrated in FIG. 3, each of the substrate placement racks 110 may be formed in substantially a U-shape.

The substrate placement rack holder 120 integrally holds the plurality of substrate placement racks 110. Also, the substrate placement rack holder 120 is connected to be interposed in the moving mechanism 130.

The moving mechanism 130 is a multi-joint arm configured to rotate, extend and retract, for example, the plurality of substrate placement racks 110. In the example illustrated in FIG. 3, the moving mechanism 130 includes a first arm unit 131 connected to a lower end portion of the substrate placement rack holder 120 in the longitudinal direction, and a second arm unit 132 connected to an upper end portion of the substrate placement rack holder 120 in the longitudinal direction. That is, the moving mechanism 130 has the first arm unit 131 and the second arm unit 132 which are coupled such that the substrate placement rack holder 120 is interposed between the first arm unit 131 and the second arm unit 132. Also, the moving mechanism 130 has connecting portions 133a and 133b which connect the first arm unit 131 to the second arm unit 132.

The first arm unit 131 includes arm portions 131a, 131b, 131c, and 131d, joint portions 131e and 131f, and a first support part 131g supported from the outside. The arm portions 131a and 131b of the first arm unit 131 are supported on the bottom surface of the housing of the transfer module 10 through the first support part 131g and the support 11, and are rotatable around a vertical straight line that passes through the center of the first support part 131g (see the long and short dashed line in FIG. 3) as a rotation axis. The arm portion 131a is connected to the arm portion 131c through the joint portion 131e, and the arm portion 131b is connected to the arm portion 131d through the joint portion 131f. The arm portion 131c is rotatable around the joint portion 131e as an axis, and the arm portion 131d is rotatable around the joint portion 131f as an axis. The arm portions 131c and 131d are connected to the lower end portion of the substrate placement rack holder 120 in the longitudinal direction. As shown in FIG. 3, the arm portions 131a and 131c constitute a lower-right arm whereas the arm portions 131b and 131d constitute a lower-left arm with respect to a line connecting the center of the substrate placement rack holder 120 and the center of the first support part 131g.

The second arm unit 132 is provided to overlap the first arm unit 131 in a plan view, and includes arm portions 132a, 132b, 132c, and 132d, joint portions 132e and 132f, and a second support part 132g supported form the outside. The arm portions 132a and 132b of the second arm unit 132 are supported on, for example, the top surface of the housing of the transfer module 10 through the second support part 132g, and are rotatable around a vertical straight line that passes through the center of the second support part 132g (see, the long and short dashed line in FIG. 3) as a rotation axis. The arm portion 132a is connected to the arm portion 132c through the joint portion 132e, and the arm portion 132b is connected to the arm portion 132d through the joint portion 132f. The arm portion 132c is rotatable around the joint portion 132e as an axis, and the arm portion 132d is rotatable around the joint portion 132f as an axis. The arm portions 132c and 132d are connected to the upper end portion of the substrate placement rack holder 120 in the longitudinal direction. As shown in FIG. 3, the arm portions 132a and 132c constitute an upper-right arm whereas the arm portions 132b and 132d constitute an upper-left arm with respect to a line connecting the center of the substrate placement rack holder 120 and the center of the second support part 132g.

Meanwhile, in FIG. 3, descriptions have been made on the configuration where the first arm unit 131 has the four arm portions 131a, 131b, 131c and 131d, the two joint portions 131e and 131f, and the first support part 131g, and the second arm unit 132 has the four arm portions 132a, 132b, 132c and 132d, the two joint portions 132e and 132f, and the second support part 132g, but the present disclosure is not limited thereto.

For example, a configuration where the first arm unit 131 has two arm portions 131a and 131c, one joint portion 131e, and a first support part 131g, and the second arm unit 132 has two arm portions 132a and 132c, one joint portion 132e, and a second support part 132g may be employed. Also, for example, a configuration where the first arm unit 131 has four arm portions 131a, 131b, 131c and 131d, two joint portions 131e and 131f, and a first support part 131g, and the second arm unit 132 has two arm portions 132a and 132c, one joint portion 132e, and a second support part 132g may be employed.

Also, for example, a configuration where the first arm unit 131 is not provided with the first support part 131g, and the arm portions 131a and 131b as supports are directly supported on the bottom surface of the housing of the transfer module 10 may be employed. Also, for example, a configuration where the second arm unit 132 is not provided with the second support part 132g, and the arm portions 132a and 132b as supports are directly supported on the top surface of the housing of the transfer module 10 may be employed.

The connecting portions 133a and 133b are rod-shaped members that connect the first arm unit 131 to the second arm unit 132. In the example illustrated in FIG. 3, the lower end portion of the connecting portion 133a in the longitudinal direction is connected to the arm portion 131c of the first arm unit 131, and the upper end portion of the connecting portion 133a in the longitudinal direction is connected to the arm portion 132c of the second arm unit 132. Also, the lower end portion of the connecting portion 133b in the longitudinal direction is connected to the arm portion 131d of the first arm unit 131, and the upper end portion of the connecting portion 133b in the longitudinal direction is connected to the arm portion 132d of the second arm unit 132. Accordingly, the first arm unit 131 and the second arm unit 132 are operable in interlocking with each other. That is, when one of the first arm unit 131 and the second arm unit 132 is operated, in conjunction with this operation, the other operates.

As described above, the substrate conveyance apparatus 100a includes the plurality of substrate placement racks 110, the substrate placement rack holder 120 configured to integrally hold the plurality of substrate placement racks 110, and the moving mechanism 130 configured to integrally move the plurality of substrate placement racks 110. Also, in the substrate conveyance apparatus 100a, the upper end portion and the lower end portion of the substrate placement rack holder 120 in the longitudinal direction are connected to the moving mechanism 130, and the moving mechanism 130 is supported on the top surface and the bottom surface of the housing of the transfer module 10 at the rotational center. Accordingly, the substrate placement rack holder 120 may be suppressed from drooping with respect to the moving mechanism 130. Also, the moving mechanism 130 may be suppressed from drooping with respect to the support 11. As a result, the deflection of the substrate placement racks 110 may be suppressed. Also, the substrate conveyance apparatus 100a may be suppressed from vibrating in the vertical direction.

As described above, according to the substrate conveyance apparatus and substrate processing system according to the first exemplary embodiment, in the substrate conveyance apparatus configured to perform a multi-stage collective conveyance, the deflection of the substrate placement racks 110 may be suppressed.

[Second Exemplary Embodiment]

Figure 4:
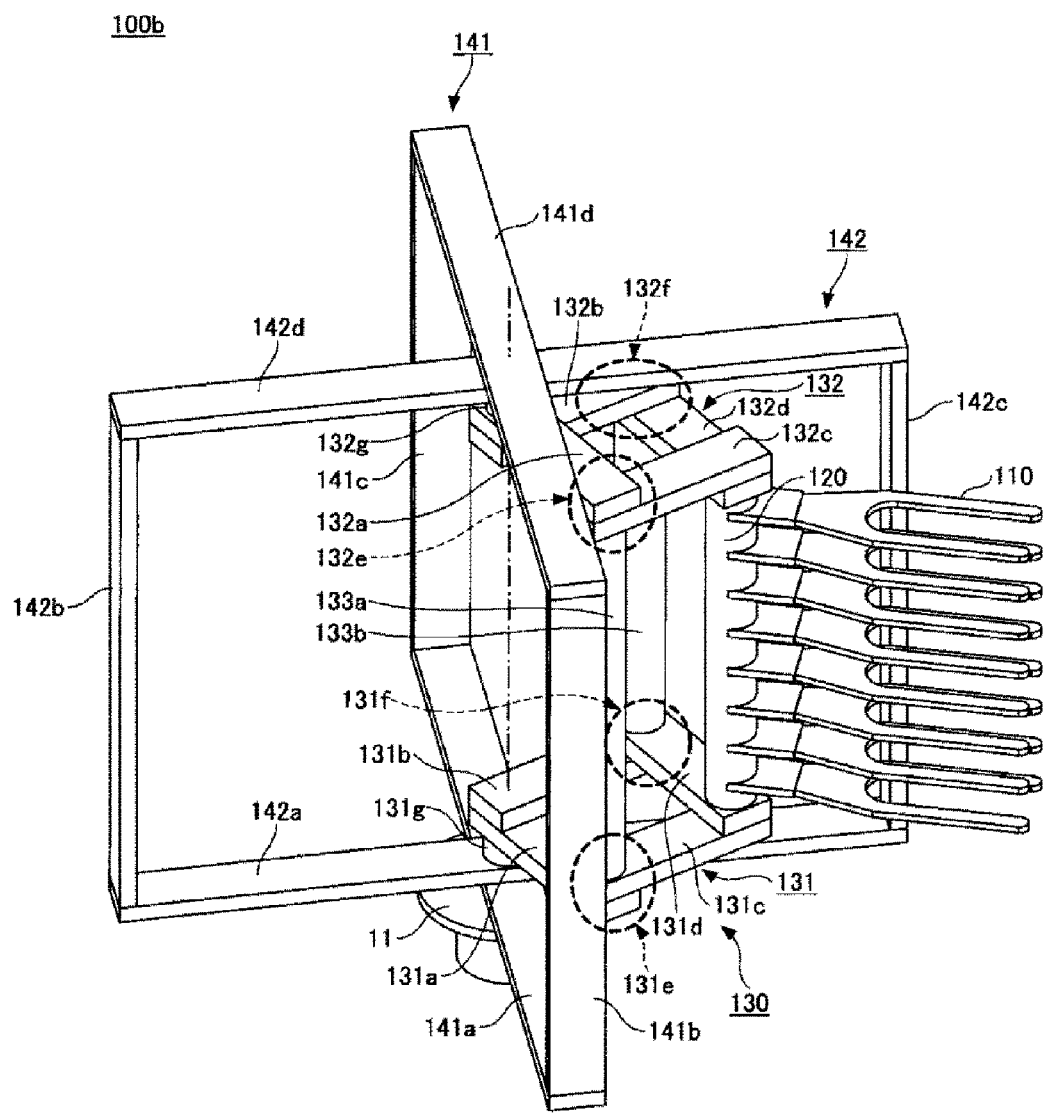
FIG. 4 is a perspective view illustrating a schematic configuration of a substrate conveyance apparatus according to a second exemplary embodiment of the present disclosure.

FIG. 4 is a perspective view illustrating a schematic configuration of a substrate conveyance apparatus according to a second exemplary embodiment of the present disclosure.

A substrate conveyance apparatus 100b according to the second exemplary embodiment is characterized in that it further includes a frame in addition to the substrate conveyance apparatus 100a described in the first exemplary embodiment. Meanwhile, other configurations may have the same as those of the substrate conveyance apparatus 100a described in the first exemplary embodiment, and thus their descriptions will be omitted herein.

As illustrated in FIG. 4, the frame includes, for example, a first frame 141 and a second frame 142. Meanwhile, the number of frames may be two or more in view of the rigidity of the substrate conveyance apparatus 100b, but is not particularly limited in the present disclosure.

As illustrated in FIG. 4, the first frame 141 is, for example, a rectangular frame, and includes a lower frame 141a, a vertical frame 141b, a vertical frame 141c, and an upper frame 141d. The lower frame 141a is supported on the bottom surface of the housing of the transfer module 10 through the support 11. One end of the vertical frame 141b is fixed to one end of the lower frame 141a, and one end of the vertical frame 141c is fixed to the other end of the lower frame 141a. The vertical frame 141b and the vertical frame 141c are disposed parallel to each other. That is, the vertical frame 141b and the vertical frame 141c constitute a pair. The upper frame 141d is fixed to the other end of the vertical frame 141b and the other end of the vertical frame 141c, and is disposed parallel to the lower frame 141a.

As illustrated in FIG. 4, the second frame 142 is, for example, a rectangular frame, and includes a lower frame 142a, a vertical frame 142b, a vertical frame 142c, and an upper frame 142d. The lower frame 142a is connected to the lower frame 141a of the first frame 141. The upper frame 142d is connected to the upper frame 141d of the first frame 141. The vertical frame 142b and the vertical frame 142c are fixed to both ends of the lower frame 142a, respectively, and to both ends of the upper frame 142d, respectively. The vertical frame 142b and the vertical frame 142c are disposed parallel to each other. That is, the vertical frame 142b and the vertical frame 142c constitute a pair.

Also, the second frame 142 is provided to be perpendicular to the first frame 141, for example, in a plan view.

The moving mechanism 130 of the substrate conveyance apparatus 100b is rotatably attached to the lower frame 142a and the upper frame 142d of the second frame 142. More specifically, the arm portions 131a and 131b of the first arm unit 131 are rotatably supported on the lower frame 142a of the second frame 142 through the first support part 131g. The arm portions 132a and 132b of the second arm unit 132 are rotatably supported on the upper frame 142d of the second frame 142 through the second support part 132g. Accordingly, the moving mechanism 130 rotates around the first support part 131g and the second support part 132g as an axis.

Also, in the substrate conveyance apparatus 100b according to the second exemplary embodiment, the first arm unit 131 is supported on the bottom surface of the housing of the transfer module 10 through the frame and the support 11. Meanwhile, the second arm unit 132 is supported by the frame, but is not supported on the housing of the transfer module 10. That is, the substrate conveyance apparatus 100b is supported at one location by the housing of the transfer module 10. Accordingly, even when the housing of the transfer module 10 is deformed by, for example, a change of an internal pressure, or a change caused by thermal expansion, the substrate conveyance apparatus 100b may be suppressed from being deformed.

Meanwhile, a change of the internal pressure occurs, when, for example, the atmosphere within the transfer module 10 is changed from an air atmosphere to a vacuum atmosphere, or is changed from a vacuum atmosphere to an air atmosphere. Also, a change caused by thermal expansion occurs when, for example, a high-temperature process is performed in the process modules 20a and 20b connected to the transfer module 10.

In the substrate conveyance apparatus 100b according to the second exemplary embodiment, the plurality of substrate placement racks 110 are moved to pass between the vertical frames 141b, 141c, 142b and 142c so that a plurality of wafers W are conveyed. Accordingly, the frames may be disposed so as not to become an obstacle when the substrate placement racks 110 are moved to pass between the vertical frames 141b, 141c, 142b, and 142c.

As described above, according to the substrate conveyance apparatus and the substrate processing system according to the second exemplary embodiment, in the substrate conveyance apparatus that may perform a multi-stage collective conveyance, the deflection of the substrate placement racks 110 may be suppressed.

Particularly, in the second exemplary embodiment, even if the housing of the transfer module 10 is deformed, the deflection of the substrate placement racks 110 may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate conveyance apparatus that collectively conveys a plurality of substrates, the substrate conveyance apparatus comprising:
   a plurality of substrate placement racks disposed at intervals in a vertical direction, and configured to simultaneously place the plurality of substrates;
   a substrate placement rack holder configured to integrally hold the plurality of substrate placement racks in a vertical direction; and
   a moving mechanism connected to the substrate placement rack holder and configured to integrally move the plurality of substrate placement racks in a horizontal direction,
   wherein the moving mechanism includes:
      a first arm unit having a first support, a lower-right arm and a lower-left arm with respect to a line connecting a center of the substrate placement rack holder and a center of the first support when viewed from above, wherein a bottom of the first support is supported externally and a top of the first support is connected via the lower-right arm and the lower-left arm to a bottom of the substrate placement rack holder in a horizontal direction;
      a second arm unit having a second support, an upper-right arm and an upper-left arm with respect to a line connecting the center of the substrate placement rack holder and a center of the second support when viewed from above, wherein a top of the second support is supported externally and a bottom of the first support is connected via the upper-right arm and the upper-left arm to a top of the substrate placement rack holder in a horizontal direction; and
      a connecting portion configured to connect the first arm unit and the second arm unit with each other,
   wherein an end of each of the upper-right arm and the upper-left arm is connected to the second support and is rotatable around the center of the second support, and
   an end of each of the lower-right arm and the lower-left arm is connected to the first support and is rotatable around the center of the first support,
   wherein another end of each of the lower-right arm and the lower-left arm is connected to the bottom of the substrate placement rack holder, and
   wherein another end of each of the upper-right arm and the upper-left arm is connected to the top of the substrate placement rack holder.

2. The substrate conveyance apparatus of claim 1, wherein the moving mechanism is configured to be rotatable around a rotational axis that passes through the first support and the second support.

3. The substrate conveyance apparatus of claim 1, wherein the first arm unit and the second arm unit operates in cooperation with each other.

4. The substrate conveyance apparatus of claim 1, further comprising a frame configured to support the first support and the second support.

5. The substrate conveyance apparatus of claim 4, wherein the frame comprises:
   a lower frame configured to support the first support;
   an upper frame provided parallel to the lower frame and configured to support the second support; and
   a pair of vertical frames fixed to the lower frame and the upper frame,
   wherein the moving mechanism moves the plurality of substrate placement racks to pass between the pair of vertical frames so that the plurality of substrates are conveyed.

6. The substrate conveyance apparatus of claim 1, which is provided in a vacuum conveyance chamber.

7. The substrate conveyance apparatus of claim 6, wherein the first support is directly or indirectly rotatably supported on a bottom surface of the vacuum conveyance chamber, and
   the second support is directly or indirectly rotatably supported on a top surface of the vacuum conveyance chamber.

8. The substrate conveyance apparatus of claim 1, wherein the first arm unit and the second arm unit constitute a multi-joint arm.

9. The substrate conveyance apparatus of claim 1, wherein the first support and the second support are spaced apart from each other.

10. The substrate conveyance apparatus of claim 1, wherein the substrate placement rack holder is cylinder-shaped, and each of the another ends of the upper-right arm and the upper-left arm and each of the another ends of the lower-right arm and the lower-left arm are rotatable around the center of the substrate placement rack holder.

11. The substrate conveyance apparatus of claim 1, wherein:
   the upper-left arm comprises a first upper-left arm portion connected to the second support and a second upper-left arm portion connected to the top of the substrate placement rack holder,
   the upper-right arm comprises a first upper-right arm portion connected to the second support and a second upper-right arm portion connected to the top of the substrate placement rack holder, an end of the first upper-left arm portion and an end of the second upper-left arm portion are rotatable about a first joint, and an end of the first upper-right arm portion and an end of the second upper-right arm portion are rotatable about a second joint.

12. The substrate conveyance apparatus of claim 11, wherein:

the lower-left arm comprises a first lower-left arm portion connected to the first support and a second lower-left arm portion connected to the bottom of the substrate placement rack holder, the lower-right arm comprises a first lower-right arm portion connected to the first support and a second lower-right arm portion connected to the bottom of the substrate placement rack holder, an end of the first lower-left arm portion and an end of the second lower-left arm portion are rotatable about a third joint, an end of the first lower-right arm portion and an end of the second lower-right arm portion are rotatable about a fourth joint.

13. The substrate conveyance apparatus of claim 12, wherein the first joint is connected to the third joint, and the second joint is connected to the fourth joint.

* * * * *